United States Patent [19]

Nakamura

[11] Patent Number: 4,797,343
[45] Date of Patent: Jan. 10, 1989

[54] LIGHT-SENSITIVE MATERIAL CONTAINING SILVER HALIDE, REDUCING AGENT AND POLYMERIZABLE COMPOUND

[75] Inventor: Taku Nakamura, Kanagawa, Japan

[73] Assignee: Fuji Photo Film Co., Ltd., Kanagawa, Japan

[21] Appl. No.: 43,129

[22] Filed: Apr. 27, 1987

[30] Foreign Application Priority Data

Apr. 25, 1986 [JP] Japan .................. 61-96340

[51] Int. Cl.⁴ .................. G03C 5/54; G03C 1/68; G03C 1/06
[52] U.S. Cl. .................. 430/138; 430/203; 430/264; 430/271; 430/281; 430/617; 430/955
[58] Field of Search .............. 430/138, 203, 617, 955, 430/264, 270, 281, 271

[56] References Cited

U.S. PATENT DOCUMENTS

| | | | |
|---|---|---|---|
| 4,514,493 | 4/1985 | Hirai et al. | 430/203 |
| 4,622,289 | 11/1986 | Hirai et al. | 430/203 |
| 4,629,676 | 12/1986 | Hayakawa et al. | 430/203 |
| 4,693,954 | 9/1987 | Naito | 430/203 |

Primary Examiner—Richard L. Schilling
Attorney, Agent, or Firm—Sughrue, Mion, Zinn, Macpeak & Seas

[57] ABSTRACT

A light-sensitive material comprising a light-sensitive layer which contains silver halide, a reducing agent and a polymerizable compound and a layer containing a base or base precursor, both of which are provided on the same side of a support. A barrier layer which keeps the base or base precursor from the light-sensitive layer and, when heated, allows transmission of the base or base precursor therethrough can be provided between the light-sensitive layer and the layer containing a base or base precursor.

11 Claims, 1 Drawing Sheet

LIGHT-SENSITIVE MATERIAL CONTAINING SILVER HALIDE, REDUCING AGENT AND POLYMERIZABLE COMPOUND

BACKGROUND OF THE INVENTION

1. Field of the Invention

This invention relates to a light-sensitive material comprising a light-sensitive layer containing silver halide, a reducing agent and a polymerizable compound provided on a support.

2. Description of the Prior Art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methdos, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized in the prior where a latent image of the silver halide has been formed.

Japanese Patent Provisional Publication No. 61(1986)-260241 (corresponding to U.S. patent application Ser. No. 854,640) describes another image forming method in which the polymerizable compound in a portion where a latent image of the silver halide has not been formed is polymerized. In this method, when the material is heated, the reducing agent functions as polymerization inhibitor in the portion where a latent image of the silver halide has been formed, and the polymerizable compound in the other portion is polymerized.

Japanese Patent Provisional Publication No. 61(1986)-73145 describes an image forming method in which a light-sensitive material containing a color image forming substance is used for forming a color image. Further, the Publication describes a base or base precursor which is one of optional components (image formation accelerator) contained in the light-sensitive layer.

SUMMARY OF THE INVENTION

The present invention has found that the sensitivity of a light-sensitive material which contains a base or base precursor in the light-sensitive layer tends to lower while the material is preserved under certain condition.

An object of the present invention is to provide a light-sensitive material which is improved in the preservability and gives an improved clear image.

There is provided by the present invention a light-sensitive material comprising a light-sensitive layer which contains silver halide, a reducing agent and a polymerizable compound and a layer containing a base or base precursor, both of which are provided on the same side of a support.

In the light-sensitive material of the invention, a barrier layer is preferably provided between the light-sensitive layer and the layer containing a base or base precursor, said barrier layer keeping the base or base precursor from the light-sensitive layer and, when heated, allows transmission of the base or base precursor therethrough.

The light-sensitive material of the invention is characterized in that the base or base precursor is contained in a different layer from the light-sensitive layer.

The present invention has found that when the components of the light-sensitive material, such as silver halide, a reducing agent are in contact with the base or base precursor, these components have been deteriorated because of an oxidation-reaction caused by oxygen in the air, and that the deterioration of the components has lowered the sensitivity of the light-sensitive material in the preservation.

In the light-sensitive material of the invention, the base or base precursor is contained in a different layer from the light-sensitive layer, and thus it is separated from the components of the light-sensitive layer. Therefore, the sensitivity of the light-sensitive material of the invention can be maintained during the period of preservation. Further, the base or base precursor can permeate the light-sensitive layer while the development process, so that the base or base procursor can sufficiently function as an image formation accelerator in the light-sensitive layer. Therefore, the light-sensitive material of the invention can give an improved clear image, even if the material is preserved for a long term or under severe conditions.

In the case that the light-sensitive material has a barrier layer provided between the light-sensitive layer and the layer containing a base or base precursor, the base or base precursor is almost entirely separated from the components of the light-sensitive layer. Therefore, the light-sensitive material can be more improved in the preservability.

DETAILED DESCRIPTION OF THE INVENTION

Figure 1:
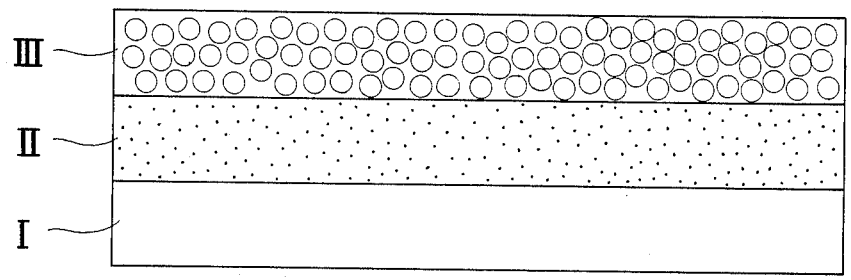
FIG. 1 shows a vertical section of the light-sensitive material according to an embodiment of the invention.

The base and the base precursor which can be used in the light-sensitive material of the present invention are described in Japanese Patent Provisional Publication No. 61(1986)-73145 (corresponding to U.S. Pat. No. 4,629,676 and European Patent Provisional Publication No. 017463A2).

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleopohilic substitution, Lossen rearrangement, or Beckmann rearrangement, and the like; and those capable of releasing bases by electrolysis. Preferred examples of the base precursors include guanidine trichloroacetate, piperidine trichloroacetete, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% weight, based on the total solid content of the light-sensitive layer. These bases or base precursors can be used singly or in combination.

The layer containing a base or base precursor can be composed of the above-mentioned base or base precursor, or more preferably the layer further contains a binder in addition to the base or base precursor. Examples of the binder are the same as that employed in the following light-sensitive layer. Among them, gelatin, gelatin derivatives, polyvinyl alcohol, polyethylene oxide and cellulose derivatives are preferred.

Further, the layer containing a base or base precursor in the light-sensitive material of the invetion can be composed of microcapsules which contain the base or base precursor. The base or base precursor can be contained in the microcapsules under condition that the base or base precursor is dissolved or dispersed in an aqueous solution of a water retention agent, or under condition that the base or base precursor is adsorbed on solid particles.

The layer containing a base or base precursor can be arranged between the light-sensitive layer and support, or arranged on the surface of the light-sensitive layer. Alternatively the two layers can be respectively arranged between the light-sensitive layer and the support, and arranged on the surface of the light-sensitive layer. In a general way, the layer containing a base or base precursor is preferably arranged between the light-sensitive layer and the support.

FIG. 1 shows a vertical section of the light-sensitive material according to a preferred embodiment of the invention. As shown in FIG. 1, the preferred embodiment of the light-sensitive material comprises the support (I), the layer containing a base or base precursor (II), and the light-sensitive layer (III), in the order.

The light-sensitive material preferably has a barrier layer provided between the light-sensitive layer and the layer containing a base or base precursor. In the light-sensitive material having the barrier layer, the base or base precursor is almost entirely separated from the components of the light-sensitive layer, and thus, the light-sensitive material of the invention can be more improved in the preservability.

The barrier layer is a layer having a function of keeping the base or base precursor from the light-sensitive layer and, when heated, allowing transmission of the base or base precursor therethrough. An example of the barrier layer having the function is a layer comprising a material which is in a solid state at room temperature and is in a molten state in a heat development process (generally at 80° to 160° C.). Namely, the barrier layer can be composed of a substance having a melting point of from 40° to 120° C. Further, the barrier layer can comprise a material which may be cracked by the contraction of itself in the heat process or a material which may be softened in the heat process. An example of these materials is a polymer having a glass transition point of not higher than 120° C.

As mentioned above, the barrier layer preferably contains a substance having a melting point of from 40° to 120° C. and/or a polymer having a glass transition point of not higher than 120° C. More preferably, the barrier layer contains both of the substance and the polymer. In this case, the substance having a melting point of from 400° to 120° C. is preferably present in an amount of not less than 5 weight % of the total amount of the substance and the polymer, and more preferably present in an amount of from 10 to 60 weight % of the total amount.

The substance having a melting point of from 40° to 120° C. contained in the barrier layer preferably is insoluble in water. Examples of the substrate include hardened oil or fat (e.g., hardened caster oil, hardened soybean oil, hardened rape oil, hardened beef tallow, hardened coconut oil, hardened cotton seed oil, hardened whale oil, hardened fil oil) higher, fatty acid (e.g., palimitic acid, stearic acid, behenic acid, oleic acid), wax (e.g., beeswax, carnauba wax, spermaceti), ester of higher fatty acid (e.g., glycerin monostearate, glycerin distearate), amide of higher fatty acid (e.g., stearamide) and higher fatty alcohol (e.g., stearyl alcohol).

The polymer having a glass transition point of not higher than 120° C. contained in the barrier layer is also preferably insoluble in water. Examples of the polymer include polyethylene, polypropylene, styrene/butadiene copolymer, styrene/acrylonitrile/butadiene copolymer, polymethyl acrylate, polyethyl acrylate, polybutyl acrylate, polybenzyl acrylate, polymethyl methacrylate, polyethyl methacrylate, polybutyl methacrylate, polyisobutyl methacrylate, poly-2-ethylhexyl methacrylate, polyvinyl chloride, polyvinylidene chloride, polyvinyl formal, polyvinyl butyral, polyvinyl acetate, polydiacetoneacrylamide, cellulose diacetate, cellulose triacetate and cellulose acetate phthalate.

The thickness of the barrier layer preferably ranges from 0.1 to 30 μm, and more preferably ranges from 2 to 20 μm.

The barrier layer is provided between the light-sensitive layer and the layer containing a base or base precursor. As mentioned above, there is no specific limitation with respect to the order of the light-sensitive layer and the layer containing a base or base precursor.

Figure 2:
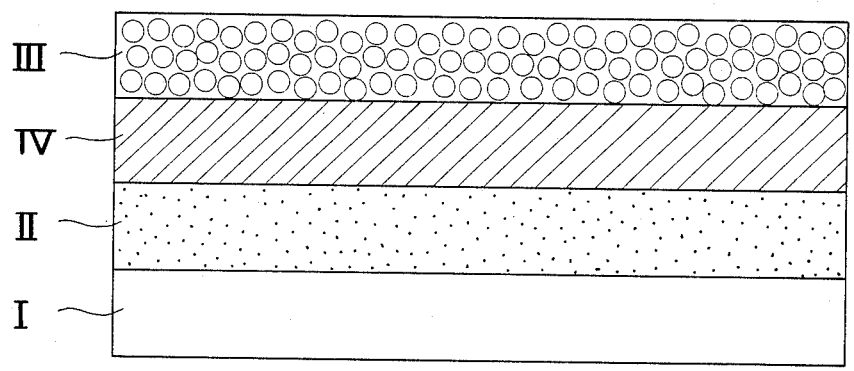
FIG. 2 shows a vertical section of the light-sensitive material according to another embodiment of the invention.

FIG. 2 shows a vertical section of the light-sensitive material according to another preferred embodiment of the invention employing a barrier layer. As shown in FIG. 2, teh preferred embodiment of the light-sensitive material comprises the support (I), the layer containing a base or base precursor (II), the barrier layer keeping the base or base precursor from the light-sensitive layer and, when heated, allowing transmission of the base or base precursor therethrough (IV), and the light-sensitive layer (III), in this order.

The silver halide, the reducing agent, the polymerizable compound and the support which constitutes the light-sensitive material of the invention are described below. Thus composed material is referred hereinafter to as "light-sensitive material".

There is no specific limitation with respect to silver halide contained in the light-sensitive layer of the light-sensitive material. Examples of the silver halides include as silver chloride, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed. A silver halide grain having a core/shell structure in which the silver iodide content in the shell is higher than that in the core can be also employed.

There is no specific limitation on the crystal habit of silver halide grains. For example, a tabular grain having an aspect ratio of not less than 3 can be employed.

Two or morekinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 μm, more preferably 0.001 to 2 μm.

The total silver content (including silver halide and an organic silver salt which is one of optional components) in the light-sensitive layer preferably is in the range of from 0.1 mg/m² to 10 g/m². The silver content of the silver halide in the light-sensitive layer preferably is not more than 0.1 g/m², more preferably in the range of from 1 mg to 90 mg/m².

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-amino-phenols, p-phenylenediamines, 3-pyrazolidones, 3-amino-pyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, 291-334 (1977), Research Disclosure No. 17029, 9-15 (June 1978), and Research Disclosure No. 17643, 22-31 (December 1978). The reducing agents described in these publications can be employed in the light-sensitive material of the present invention. Thus, "the reducing agent(s)" in the present specification means to include all of the reducing agents described in the above mentioned publications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-)p- or 0-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrzine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)-butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 10-formyl-2-[4-{20-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-40-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the abovementioned silver halide and an organic silver salt).

There is no specific limitation with respect to the polymerizable compound, and any known polymerizable componds including monomers, oligomers, and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material are described in the above-mentioned and later-mentioned publications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturate group are preferred.

Examples of compounds having an ethylenic unsaturated group include acrylic acid, salts or acrylic acid, acrylic esters, acrylamides, methacrylic acid, salts of methacrylic acid, methacrylic esterers, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyehtyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetracmethacrylate, and dimethacrylate of polyoxyalkylenated bisphenol A.

The polymerizable compounds can be used singly or in combination of two or more compounds. For example, a mixture of two ore more polymerizable compunds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and teh polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the abovementioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethlene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610.

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the color image forming substances may be also contained in the oil droplets.

The oil droplets of the polymerizable compounds are preferably prepared in the form of microcapsules. There is no specific limitation on preparation of microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 $\mu$m, more preferably 1 to 25 $\mu$m, most preferably 3 to 20 $\mu$m. In the case that silver halide grains are contained in the microcapsule, the mean grain size of the silver halide grains preferably is not more than the 5th part of the mean size of the microcapsules, more preferably is not more than the 10th part. It is observed that when the mean size ofthe microcapsules is not less than 5 times as much as the mean grain size of silver halide grains, even and uniform image can be obtained.

In the case that silver halide grains are contained in the microcapsules, the silver halide grains are preferably arranged in the shell material of the microcapsules.

Further, two or more kinds of the microcapsules differing from each other with respect to at least one of the silver halide, the polymerizable compound and the color image forming substance can be employed. Furthermore, three or more kinds of the microcapsules differing from each other with respect to the color image forming substance is preferably employed to form a full color image.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator and solvent of the polymerizable compound.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Publication Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention inlcude commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acidbase reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminar promoted by the Society of Kinki Chemical Industry, "The Newest Chemistry of Coloring Matter—Attractive Application and New Development as a Functional Coloring Matter", 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, activemethylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

In the case that the color image forming substance comprising two components (e.g., a color former and a developer), one component and the polymerizable compound are contained in the microcapsule, and the other component is arranged outside of the microcapsule in the light-sensitive layer, a color image can be formed on the ligth-sensitive layer.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into oils, surface active agents, compounds functioning as an antifogging agent and/or a development accelerator, hotmelt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear iamge having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acethylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —$SO_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure 26–28 (December 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicyumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% weight, based on amount of the polymerizable compound. In a system in which the polymerizable compound within the area where the latent image has not beeen formed is polymerized, the thermal polymerization initiators are preferably incorporated into the light-sensitive layer. The light-sensitive material employing the thermal polymerization initiators is described by Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Example of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

The photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and appliations concerning the light-sensitive material, and in Research Disclosure Vol. 170, No. 17029, 9–15 (June 1978).

Examples of auxiliary layers which are optionally arranged on the light-sensitive material include an image-receiving layer, a heating layer, and antistatic layer, an anticurl layer, a release layer and a cover sheet or a protective layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The layer containing a base or base precursor can be prepared by coating a coating solution containing the base or base precursor on the support before and/or after the preparation of the light-sensitive layer.

Further, in the case that the barrier layer is arranged, the barrier layer can be also prepared by using a coating solution in a similar manner. Alternatively, the barrier layer can be prepared by forming the light-sensitive layer or the layer containing a base or base precursor on a support, and then immersing the support in a solution containing components of the barrier layer.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent iamge predominantly on the surfadce of silver halide grains, or of an inner latent image type that forms a latent image predominantly in the interior of the grains. A direct reversal emulsion comprising an inner latent iamge type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N0-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc slat, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resutling emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of teh conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance cna be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, -OH or nitrogen having a lone electron-pair are preferably introduced into the polymerizable compound prior to the preparation of the light-sensitive composition. The polymer has a function of dispersing silver halide or other component inthe polymerizable compound very uniformly as well as a function of keeping thus dispersed state. Futher, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376,a nd 4,089,802; a process of using melamine-formaldehyde resins hydroxypropyl cellulose or like wall-forming materials as described in U.S. Pat. No. 4,025,455; and in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion. The other components can be added to the coating solution in a similar manner as the emulsion of the polymerizable compound.

A light-sensitive material of the invention can be prepared by coating and drying the above-prepared coating solutions of the light-sensitive layer and the layer containing a base or base precursor on a support in the conventional manner. The barrier layer can be prepared by coating or immersing as mentioned above, after the light-sensitive layer or the layer containing a base or base precursor is prepared on the support.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either a monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

In the above development process, a polymer image can be formed on the light-sensitive layer. A pigment image can be also obtained by fixing pigments to the polymer image.

Further, a color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be empoloyed as the support of the above mentioned light-sensitive material. In the case that a porous material, such as paper is employed as teh support of the image-receiving mterial, the porous suport preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. Further, the image-receiving layer can contain a white pigment (e.g., titanium dioxide) to function as a white reflection layer. Furthermore, a photo polymerization initiator or a thermalpolymerization initiator can be contained in the image-receiving layer to polymerize the unpolymerized polymerizable compound.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer.

After the development process, pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples wihtout limiting the invention.

EXAMPLE 1

Preparation of silver halide emulsion

In 3 l of water were dissolved 40 g of gelatin and 23.8 g of potassium bromide and the resulting gelatin solution was kept at 50° C. To the gelatin solution, 200 ml of an aqueous solution containing 34 g of silver nitrate was added over a period of 15 minutes while stirring. To the solution, 100 ml of an aqueous solution containing 3.3 g of potassium iodide was added over a period of 2 minutes to obtain a silver bromoiodide emulsion. After the emulsion was adjusted to a pH for sedimentation, excess salts were removed, and the emulsion was adjusted to a pH of 6.0. The yield of the emulsion was 400 g.

Preparation of light-sensitive composition

In 100 g of Aronix M-210 (tradename of Toagosei Chemical Industry Co., Ltd.) were dissolved 0.40 g of the following copolymer and 6.00 g of Pargascript Red I-6-B (tradename of Chiba-Geigy).

(Copolymer)

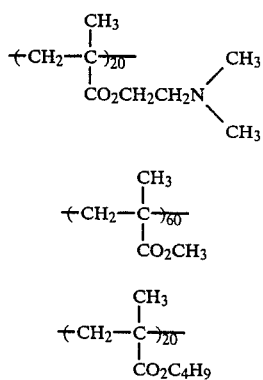

In 18.00 g of the resulting solution was dissolved 0.65 g of the following reducing agent (I) and 1.22 g of the following reducing agent (II), 0.20 g of 1% ethyl acetate solution of the following antifoggin agent and 0.36 g of Emulex NP-8 (tradename of Nippon Emulsion Co., Ltd.).

(Reducing agent (I))

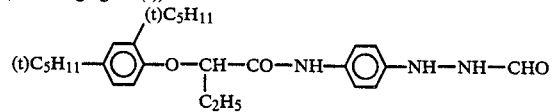

(Reducing agent (II))

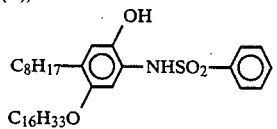

(Antifogging agent)

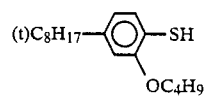

To the solution was added 1.80 g of methylene chloride, and the resulting solution was made uniform. Further, to the resulting solution were added 4.06 g of the silver halide emulsion, and the mixture was stirred at 18,000 r.p.m. for 3 minutes to obtain a light-sensitive composition.

Preparation of light-sensitive microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 min. to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde, and 2.74 g of 8.76% aqueous solution of ammonium sulfate in this order, and the mixture was heated at 60° C. for 2 hours while stirring. After the mixture was adjusted to a pH of 7.0 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

In 47.5 g of 5 wt. % gelatin solution was dissolved 3.35 g of 1,4-diazabicyclo[2,2,2]octane. The resulting solution was coated on a polyethylene terephthalate film (thickness: 100 μm) using a coating rod of #40 to give a layer having a wet thickness of 70 μm and dried at 40° C. for 30 minutes to obtain a film having a base layer.

To 10.0 g of the light-sensitive microcapsule dispersion was added 1.0 g of 10% aqueous solution of Emulex NP-8 (tradename of Nippon Emulsion Co., Ltd.) to prepare a coating solution of the light-sensitive layer.

The coating solution was coated on the base layer of the film using a coating rod of #40 to give a layer having a wet thickness of 70 μm and air-dried at room temperature to obtain a light-sensitive material (A).

EXAMPLE 2

Preparation of light-sensitive material

On the base layer of the film prepared in Example 1 was coated 5 wt. % ethyl acetate solution of polyethyl methacrylate (coating solution of barrier layer (b)) using a coating rod of #20 to give a layer having a wet thickness of 35 μm and dried at room temperature for 30 minutes to obtain a film having a base layer and a barrier layer.

To 10.0 g of the light-sensitive microcapsule dispersion prepared in Example 1 was added 1.0 g of 10% aqueous solution of Emulex NP-8 (tradename of Nippon Emulsion Co., Ltd.) to prepare a coating solution of the light-sensitive layer. The coating solution was coated on the barrier layer of the film using a coating rod of #40 to give a layer having a wet thickness of 70

μm and air-dried at room temperature to obtain a light-sensitive material (B).

EXAMPLE 3

Preparation of light-sensitive material

Each of the light-sensitive materials (C) to (G) was prepared in the same manner as in Example 2 except that each of the following coating solutions of barrier layers (c) to (g) was respectively used in place of the coating solution of barrier layer (b).

| | |
|---|---|
| (c) | 5 wt. % Ethanol solution of polyvinyl butyral |
| (d) | 5 wt. % Ethyl acetate solution of polyvinyl acetate |
| (e) | 3 wt. % Ethanol solution of castor wax |
| (f) | Ethanol solution of castor wax (2 wt. %) and polyvinyl butyral (5 wt. %) |
| (g) | Ethyl acetate solution of castor wax (2 wt. %) and polyisobutyl methacrylate (3 wt. %) |

COMPARISON EXAMPLE 1

Preparation of light-sensitive material

To 10.0 g of the light-sensitive microcapsule dispersion prepared in Example 1 were added 1.0 g of 10% aqueous solution for Emulex NP-8 (tradename of Nippon Emulsion Co., Ltd.) and 1.9 g of 10% aqueous solution of 1,4-diazabicyclo[2,2,2]octane to prepare a coating solution of light-sensitive layer. The coating solution was coated on a polyethylene terephthalate film (thickness: 100 μm) using a coating rod of #40 to give a layer having a wet thickness of 70 μm and air-dried at room temperature to obtain a light-sensitive material (H).

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finally dispersed in Dynomill dispersing device. To 200 g of the resulting dispersion were added 6 g of 50 % latex of SBR (styrene-butadiene rubber) and 55 g of 8% aqueous solution of polyvinyl alcohol, and the resulting mixture was made uniform.

The mixture was then uniformly coated on an art paper having a basis weight of 43 g/m² to give a layer having a wet thickness of 30 μm and dried to obtain an image-receiving material.

Evaluation of light-sensitive material

Each of the light-sensitive materials prepared in Examples 1 to 3 and Comparison Example 1 was image-wise exposed to light through a wedge filter having a density of from 0 to 5.0 using a tungsten lamp at 200 lux for 1 second, and then heated on a hot plate at 125° C. for 20 seconds. The exposed and heated light-sensitive material was then combined with the image-receiving material and passed through press rolls under pressure of 300 kg/cm² to obtain a magenta positive image on the image receiving material. The maximum density and the minimum density of the obtained image was measured using Macbeth reflection densitometer.

Further, each of the light-sensitive materials was preserved at 45° C. for 1 day or 3 days, and then evaluated as mentioned above.

The results are set forth in Table 1.

TABLE 1

| Light-Sensitive Material | Immediately | | 1 day (after Preparation) | | 3 days | |
|---|---|---|---|---|---|---|
| | Dmax | Dmin | Dmax | Dmin | Dmax | Dmin |
| (A) | 1.08 | 0.28 | 1.09 | 0.33 | 1.11 | 0.57 |
| (B) | 1.02 | 0.42 | 1.00 | 0.33 | 0.92 | 0.32 |
| (C) | 1.10 | 0.45 | 1.07 | 0.32 | 1.11 | 0.30 |
| (D) | 1.02 | 0.31 | 0.91 | 0.35 | 1.02 | 0.34 |
| (E) | 0.97 | 0.29 | 1.03 | 0.32 | 1.04 | 0.31 |
| (F) | 1.01 | 0.26 | 0.94 | 0.25 | 0.98 | 0.22 |
| (G) | 0.98 | 0.26 | 0.96 | 0.24 | 0.93 | 0.27 |
| (H) | 1.12 | 0.32 | 1.13 | 0.81 | 1.07 | 0.96 |

It is apparent from the results in Table 1 that each of the light-sensitive materials (A) to (H) is improved in the preservability and gives a clear image having a high maximum density (Dmax) and a low minimum density (Dmin) even if it has been preserved under a severe condition. Further, it is also apparent that each of the light-sensitive materials (B) to (H) having a barrier layer is more improved in the preservability.

I claim:

1. A light-sensitive material comprising a light-sensitive layer which contains silver halide, a reducing agent and a polymerizabel compound containing carbon to carbon unsaturation and a layer containing a base or base precursor, both layers being provided on the same side of a support, wherein a barrier layer is provided between the light-sensitive layer and the layer containing a base or base precursor, said barrier layer keeping the base or base precursor from the light-sensitive layer and, when heated, allowing transmission of the base or base precursor therethrough.

2. The light-sensitive material as claimed in claim 1, wherein the barrier layer comprises a ploymer having a glass transition point of not higher than 120° C., said polymer being selected from the group consisting of polyethylene, polyproylene, styrene/butadiene copolymer, stryene/acrylonitrile/butadiene copolymer, polymethyl acrylate, polyethyl acrylate, polybutyl acrylate polybenzyl acrylate, polymethyl methacrylate, polyethyl methacrylate polybutyl methacrylate polyisobutyl methacrylate, poly-2-ethylhexyl methacrylate, polyvinyl chloride, polyvinylidene chloride, polyvinyl formal, polyvinyl butyral, polyvinyl acetate, polydiacetone acrylamide, cellulose diacetate, cellulose triacetate and cellulose acetate phthalate.

3. The light-sensitive material as claimed in claim 1, wherein the barrier layer comprises a substance having a melting point of from 40° to 120° C. and a polymer having a glass transition point of not higher than 120° C., said substance being present in an amount of not less than 5 weight % of the total amount of the substance and the polymer.

4. The light-sensitive material as claimed in claim 1, wherein the light-sensitive material comprises the support, the layer containing a base or base precursor, the barrier layer and the light-sensitive layer in that order.

5. The light-sensitive material as claimed in claim 1, wherein the barrier layer comprises a substance having a melting point of from 40° to 120° C. and/or a polymer having a glass transition point of not higher than 120° C.

6. The light-sensitive material as claimed in claim 1, wherein the barrier layer has a thickness of from 0.1 to 30 μm.

7. The light-sensitive material as claimed in claim 1, wherein the light-sensitive layer further contains a color image forming substance.

8. The light-sensitive material as claimed in claim 1, wherein the polymerizable compound is contained in microcapsules which are dispersed in the light-sensitive layer.

9. The light-sensitive material as claimed in claim 1, wherein the polymerizable compound is contained in microcapsules which are dispersed in the light-sensitive layer, and the silver halide is contained in said microcapsules.

10. The light-sensitive material as claimed in claim 1, wherein the polymerizable compound is contained in microcapsules which are dispersed in the light-sensitive layer, and the silver halide and the reducing agent are contained in said microcapsules.

11. The light-sensitive material as claimed in claim 1, wherein the barrier layer comprises a substance having a melting point of from 40° to 120° C., said substance being selected from the group consisting of a hardened oil, a hardened fat, a higher fatty acid, a wax, an ester of a higher fatty acid, an amide of a higher fatty acid and a higher fatty alcohol.

* * * * *